United States Patent
Hokari

(10) Patent No.: US 9,958,514 B2
(45) Date of Patent: May 1, 2018

(54) MAGNETIC FIELD MEASUREMENT APPARATUS, MAGNETIC FIELD MEASUREMENT SYSTEM AND MAGNETIC FIELD MEASUREMENT METHOD

(71) Applicant: Seiko Epson Corporation, Tokyo (JP)

(72) Inventor: Ryuji Hokari, Ota (JP)

(73) Assignee: Seiko Epson Corporation (JP)

( * ) Notice: Subject to any disclaimer, the term of this patent is extended or adjusted under 35 U.S.C. 154(b) by 751 days.

(21) Appl. No.: 14/602,635

(22) Filed: Jan. 22, 2015

(65) Prior Publication Data

US 2015/0130457 A1     May 14, 2015

Related U.S. Application Data

(63) Continuation of application No. 13/434,972, filed on Mar. 30, 2012, now Pat. No. 9,024,634.

(30) Foreign Application Priority Data

Apr. 1, 2011 (JP) .................. 2011-081807

(51) Int. Cl.
    *G01R 33/26*        (2006.01)
    *G01R 33/032*      (2006.01)

(52) U.S. Cl.
    CPC .......... *G01R 33/26* (2013.01); *G01R 33/032* (2013.01)

(58) Field of Classification Search
    CPC .............................. G01R 33/26; G01R 33/032
    See application file for complete search history.

(56) References Cited

U.S. PATENT DOCUMENTS

| | | | |
|---|---|---|---|
| 3,214,683 A | 10/1965 | Andres | |
| 3,243,721 A | 3/1966 | Caldwell, Jr. | |
| 3,513,381 A | 5/1970 | Harper, Jr. | |
| 4,788,428 A | 11/1988 | Metcalf et al. | |
| 5,189,368 A | 2/1993 | Chase | |
| 5,227,722 A | 7/1993 | Kostyk et al. | |
| 5,272,436 A * | 12/1993 | Chaillout | G01R 33/26 324/301 |
| 5,367,259 A | 11/1994 | Matsumoto et al. | |

(Continued)

FOREIGN PATENT DOCUMENTS

| | | |
|---|---|---|
| JP | 59-025726 | 2/1984 |
| JP | 04-357481 A | 12/1992 |

(Continued)

*Primary Examiner* — Dixomara Vargas
(74) *Attorney, Agent, or Firm* — Harness, Dickey & Pierce, P.L.C.

(57) ABSTRACT

A magnetic field measurement apparatus includes a first gas cell disposed in a +z direction when seen from an object to be measured, a second gas cell disposed in the +z direction when seen from the first gas cell, a first measurement unit which measures a component of a magnetic field in the first gas cell, a second measurement unit which measures a component of a magnetic field in the second gas cell, a magnetic field generation unit which generates the magnetic field toward the second gas cell so as to reduce the component measured by the second measurement unit, and an output unit which outputs a signal in response to the difference in the components respectively measured by the first measurement unit and second measurement unit.

5 Claims, 2 Drawing Sheets

(56) References Cited

U.S. PATENT DOCUMENTS

| | | | |
|---|---|---|---|
| 6,430,960 B1 * | 8/2002 | Driehuys | G01R 33/28 165/61 |
| 6,484,532 B2 * | 11/2002 | Driehuys | G01R 33/28 62/55.5 |
| 8,054,074 B2 * | 11/2011 | Ichihara | G01R 33/0385 324/301 |
| 8,067,990 B2 | 11/2011 | Chindo et al. | |
| 8,362,768 B2 | 1/2013 | Nagasaka | |
| 8,427,146 B2 * | 4/2013 | Nagasaka | G01R 33/26 324/304 |
| 8,614,605 B2 | 12/2013 | Chindo | |
| 8,633,773 B2 | 1/2014 | Chindo | |
| 8,643,441 B2 | 2/2014 | Aoyama et al. | |
| 8,736,386 B2 | 5/2014 | Chindo | |
| 9,167,979 B2 * | 10/2015 | Skidmore | A61B 5/04009 |
| 9,529,061 B2 * | 12/2016 | Nagasaka | G01R 33/26 |

FOREIGN PATENT DOCUMENTS

| | | |
|---|---|---|
| JP | 2000-329836 A | 11/2000 |
| JP | 2001-051035 A | 2/2001 |
| JP | 2003-332781 A | 11/2003 |
| JP | 2007-170880 A | 7/2007 |
| JP | 2008-282983 A | 11/2008 |

* cited by examiner

MAGNETIC FIELD MEASUREMENT APPARATUS, MAGNETIC FIELD MEASUREMENT SYSTEM AND MAGNETIC FIELD MEASUREMENT METHOD

CROSS-REFERENCE TO RELATED APPLICATIONS

This is a continuation patent application of U.S. application Ser. No. 13/434,972 filed Mar. 30, 2012, which claims priority to Japanese Patent Application No. 2011-081807, filed Apr. 1, 2011, all of which are expressly incorporated by reference herein in their entireties.

BACKGROUND

1. Technical Field

The present invention relates to the technical field of a magnetic field measurement apparatus, a magnetic field measurement system and a magnetic field measurement method.

2. Related Art

A magnetic sensor using optical pumping is used for a magnetic field measurement apparatus or the like which measures a magnetic field which is generated from a living body. The magnetic sensor includes a cell which is filled with an atom such as alkali metal in a gaseous state. When pump light which has a circular polarization component is irradiated to the cell, the filled atom is excited. Subsequently, when probe light which has a linear polarization component is irradiated so as to cross the pump light, the excited atom rotates the polarization surface of the linearly polarized light which is included in the probe light in response to a magnetic field which is applied from the outside. The magnetic sensor measures the magnetic field by measuring a rotational angle of the polarization surface of the probe light which has passed through the cell.

However, in a case of measuring a particular weak magnetic field such as a magnetic field, which is generated from the inside of a living body, by the magnetic field measurement apparatus, there is a problem in that the magnetic field from the outside of the living body may affect the measurement.

As techniques which cancel the external magnetic field, techniques which infer and cancel a disturbing magnetic field on the basis of the amount of the magnetic field which is measured using a magnetic sensor are disclosed in JP-A-2008-282983, JP-A-2003-332781 and JP-A-2000-329836. In addition, in JP-A-2007-170880 and JP-A-2001-51035, a gradiometric magnetic sensor, which cancels the influence of the magnetic fields which are not from the target to be measured and would become noise, by measuring gradient polarization components thereof using a plurality of coils, is disclosed.

SUMMARY

An advantage of some aspects of the invention is to measure a magnetic field of an object to be measured without influence from disturbance with respect to a measurement unit which irradiates light to a gas cell and measures a component in a predetermined direction of the magnetic field in the gas cell thereof even when there is disturbance which exceeds a range which is measurable by the measurement unit.

According to an aspect of the invention, there is provided a magnetic field measurement apparatus including: a first gas cell which is disposed in a predetermined direction when seen from a position in which an object to be measured is installed; a second gas cell which is disposed in the direction when seen from the first gas cell; a first measurement unit which irradiates light to the first gas cell and measures a component in the direction of a magnetic field in the first gas cell; a second measurement unit which irradiates light to the second gas cell and measures a component in the direction of a magnetic field in the second gas cell; a magnetic field generation section which includes the object to be measured, the first gas cell and the second gas cell interposed along the direction and generates a magnetic field toward the second gas cell so as to reduce the component measured by the second measurement unit; and an output unit which outputs a signal in response to the difference in the components which are respectively measured by the first measurement unit and the second measurement unit. According to the configuration, it is possible to measure the magnetic field of the object to be measured without influence from disturbance thereof with respect to the measurement unit which measures the component in the predetermined direction of the magnetic field in the gas cell thereof by irradiating the light to the gas cell even when there is disturbance which exceeds a range which is measurable by the measurement unit.

Moreover, according to another aspect of the invention, there is provided a magnetic field measurement system including a plurality of the magnetic field measurement apparatuses in each independent direction. According to the configuration, it is possible to measure the components in the plurality of the directions in the magnetic field of the object to be measured without the influence from the disturbance even when there is the disturbance described above.

In addition, it is preferable to provide the magnetic field measurement system in which the plurality of the directions is orthogonal to one another. According to the configuration, even when there is the disturbance, it is possible to measure each component in a rectangular coordinate system in the magnetic field of the object to be measured without the influence of the disturbance.

Furthermore, according to a further aspect of the invention, there is provided a magnetic field measurement method of irradiating light to a first gas cell which is disposed in a predetermined direction when seen from a position in which an object to be measured is installed and measuring a component in the direction of a magnetic field in the first gas cell by a first measurement unit; irradiating light to a second gas cell which is disposed in the direction when seen from the first gas cell and measuring a component in the direction of a magnetic field in the second gas cell by a second measurement unit; generating the magnetic field toward the second gas cell so as to reduce the component which is measured by the second measurement unit by a magnetic field generation section which includes the object to be measured, the first gas cell and the second gas cell interposed along the direction; and outputting a signal in response to the difference in the components which are respectively measured by the first measurement unit and the second measurement unit. According to the configuration, it is possible to measure the magnetic field of the object to be measured without influence from disturbance thereof with respect to the measurement unit which measures the component in the predetermined direction of the magnetic field in the gas cell thereof by irradiating the light to the gas cell even when there is disturbance which exceeds a range which is measurable by the measurement unit.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1:
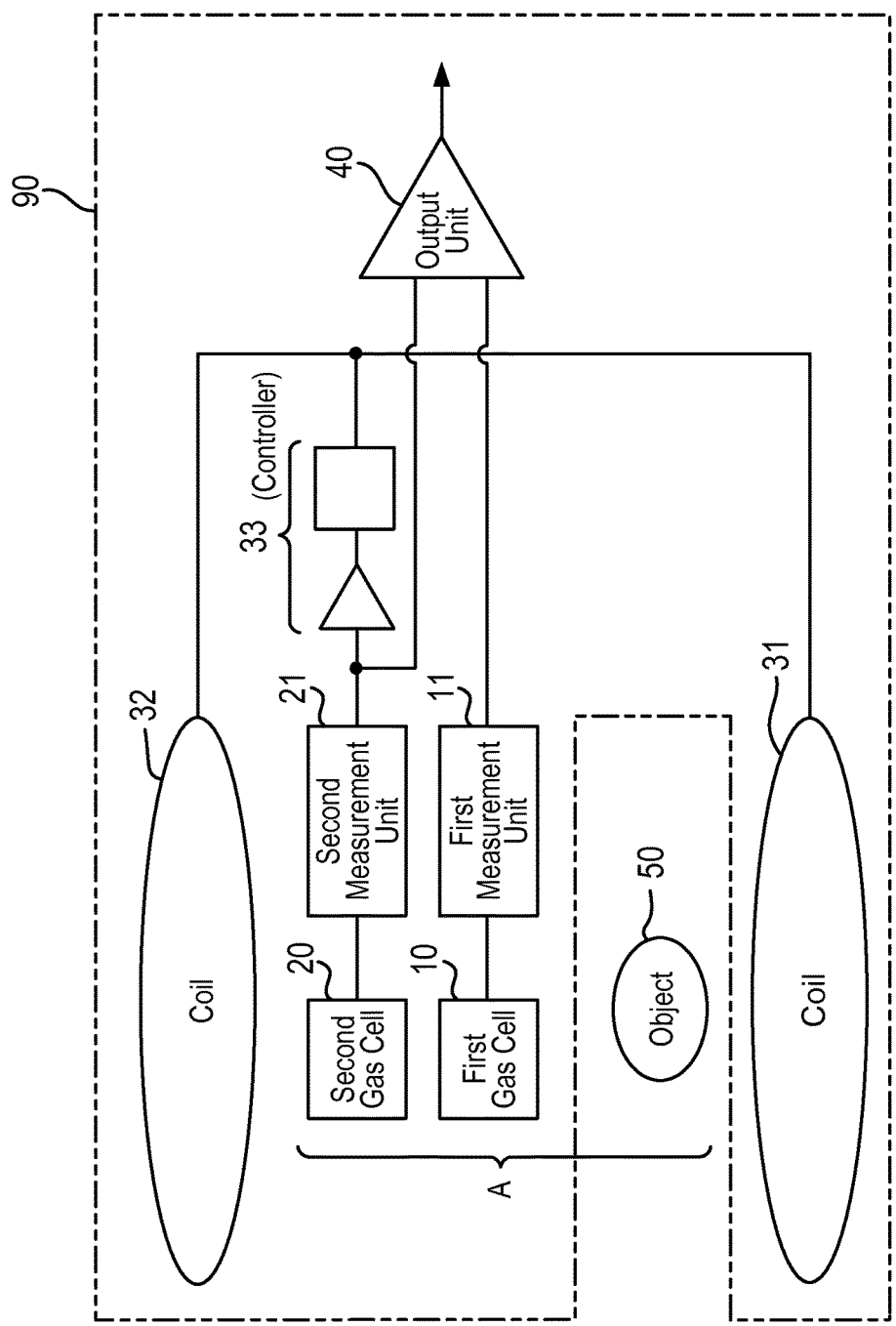
FIG. 1 is a block diagram which illustrates an outline of a magnetic field measurement apparatus according to an embodiment of the invention.
Figure 2:
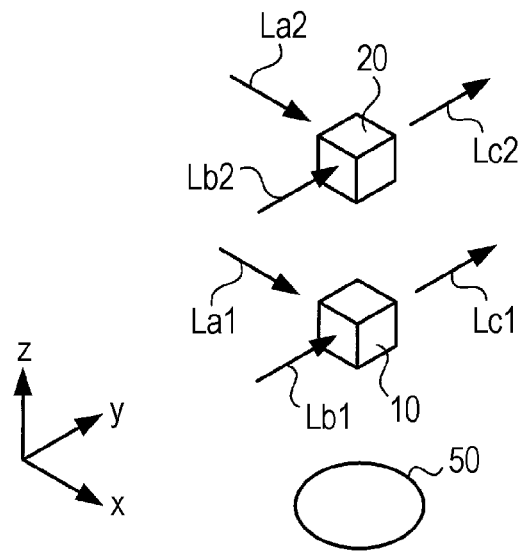
FIG. 2 is a diagram which illustrates disposition of configuration elements of the magnetic field measurement apparatus according to the embodiment of the invention.

FIG. 1 shows a block diagram illustrating an outline of a magnetic field measurement apparatus 90 according to an embodiment of the present invention. FIG. 2 shows a diagram illustrating disposition of configuration elements of the magnetic field measurement apparatus 90 according to the embodiment of the invention. In order to describe disposition of each configuration of the magnetic field measurement apparatus 90, space in which the magnetic field measurement apparatus 90 is disposed represents as xyz right hand's coordinate space. In this coordinate space, a positive x direction indicates a direction in which an x component increases, a negative x direction indicates a direction in which the x component decreases. In the same manner, a positive y direction, a negative y direction, a positive z direction and a negative z direction are also defined with respect to y and z components.

A frame which is shown by a dashed line in FIG. 1 indicates the magnetic field measurement apparatus 90. The magnetic field measurement apparatus 90 includes a first gas cell 10, a first measurement unit 11, a second gas cell 20, a second measurement unit 21, coils 31 and 32, a controller 33 and an output unit 40.

An object to be measured 50 is an object which is a measurement target of a magnetic field, for example, a human body. Both the first gas cell 10 and second gas cell 20 are cells in which gases such as alkali metal atoms are filled in internal space partitioned by a transparent member of glass or the like.

As shown in FIG. 2, the first gas cell 10 is disposed in a positive z direction which is determined in advance when seen from a position in which the object to be measured 50 is installed. The second gas cell 20 is disposed in the positive z direction which is determined in advance when seen from the first gas cell 10. In other words, the object to be measured 50, the first gas cell 10 and the second gas cell 20 are sequentially arranged along the positive z direction. Accordingly, the first gas cell 10 is an example of a first gas cell which is disposed in a direction which is determined in advance when seen from a position in which the object to be measured is installed. In addition, the second gas cell 20 is an example of a second gas cell which is disposed in a direction which is determined in advance when seen from the first gas cell.

The first measurement unit 11 includes an irradiation unit which respectively irradiates pump light which has a circular polarization component and probe light which has a linear polarization component toward the first gas cell 10 and a detection unit which detects the probe light which passes through the first gas cell 10. The irradiation unit irradiates the pump light and the probe light so as to cross over to each other or it is preferable to irradiate the pump light and the probe light so as to be orthogonal to each other. The detection unit extracts the linear polarization component among the detected probe light, specifies an angle at which the polarization surface thereof rotates after passing through the first gas cell 10 and measures a component in the positive z direction of a magnetic field in the first gas cell 10 based on the angle. Therefore, the first measurement unit 11 is an example of a first measurement unit which irradiates light to the first gas cell and measures a component in a predetermined direction of a magnetic field in the first gas cell.

The second measurement unit 21 includes the same configuration with respect to the second gas cell 20 as the configuration of the first measurement unit 11 with respect to the first gas cell 10 and measures a component in the positive z direction of a magnetic field of the second gas cell 20 in the same manner as the first measurement unit 11. Therefore, the second measurement unit 21 is an example of a second measurement unit which irradiates light to the second gas cell and measures a component in a predetermined direction of a magnetic field in the second gas cell.

In the disposition shown in FIG. 2, pump light La1 is irradiated toward the first gas cell 10 from the negative x direction when seen from the first gas cell 10 and pump light La2 is irradiated toward the second gas cell 20 from the negative x direction when seen from the second gas cell 20. Atoms such as alkali metal which are filled in the first gas cell 10 and the second gas cell 20 are excited by these pump light beams.

In addition, probe light Lb1 is irradiated toward the first gas cell 10 from the negative y direction when seen from the first gas cell 10 and probe light Lb2 is irradiated toward the second gas cell 20 from the negative y direction when seen from the second gas cell 20. Subsequently, a detection unit of the first measurement unit 11 detects probe Lc1 which passes through the first gas cell 10 and proceeds in the positive y direction when seen from the first gas cell and a detection unit of the second measurement unit 21 detects probe light Lc2 which passes through the second gas cell 20 and proceeds in the positive y direction when seen from the second gas cell 20.

The coil 31 is disposed in the negative z direction when seen from the position where the object to be measured 50 is installed and the coil 32 is disposed in the positive z direction when seen from the second gas cell 20. In other words, the coil 31 and coil 32 include the object to be measured 50, the first gas cell 10 and the second gas cell 20 which are interposed along the positive z direction.

In addition, the controller 33 is connected to the output of the second measurement unit 21. The controller 33 is a section which generates and outputs a signal in response to a measurement result by the second measurement unit 21 and includes, for example, an amplifier which amplifies the signal which is measured by the second measurement unit 21, a filter unit which extracts the signal in a determined band and an adjustment circuit unit which adjusts a signal phase. The output of the controller 33 is connected to the coil 31 and coil 32. The coil 31 and the coil 32 generate the magnetic field toward measurement space A in which the object to be measured 50, the first gas cell 10 and the second gas cell 20 are disposed in response to the signal which is output by the controller 33. To be more specific, a magnetic field of an inverse phase to the signal in response to the measurement result by the second measurement unit 21 is generated toward the measurement space A in which the second gas cell 20 is disposed so as to reduce the component which is measured by the second measurement unit 21. By receiving the magnetic field of the inverse phase, the magnetic field which is received by the second gas cell 20 from the outside of the magnetic field measurement apparatus 90 is cancelled. Moreover, since the magnetic field of the inversed phase is received by the first gas cell 10, the magnetic field due to the difference in the disposition between the first gas cell 10 and the second gas cell 20, that is, the magnetic field which is derived from a fact that the first gas cell 10 is disposed near the object to be measured 50 compared to the second gas cell 20 remains in the first gas cell 10. Therefore, the coil 31 and coil 32 are examples of magnetic field generation sections which include the object to be measured, the first gas cell, the second gas cell interposed along the direction determined in advance and generate the magnetic field toward the second gas cell so as to reduce the component measured by the second measurement unit.

The output unit 40 outputs the signal in response to the difference in the component in the positive z direction of the magnetic field in the first gas cell 10 which is measured by the first measurement unit 11 and the component in the positive z direction of the magnetic field in the second gas cell 20 which is measured by the second measurement unit 21. Therefore, the output unit 40 is an example of an output unit which outputs a signal in response to the difference in the components which are respectively measured by the first measurement unit and the second measurement unit. The magnetic field measurement apparatus indicates a value which shows the component in the positive z direction of the magnetic field in the object to be measured 50 on the basis of the signal output by the output unit 40 to a user.

For example, in a case that magnetic field noise is received from the outside which exceeds a range which is measurable by the first measurement unit 11 or the second measurement unit 21, that is, a dynamic range, unless there are the coils 31 and 32, which are provided in the magnetic field measurement apparatus 90, since either of the first measurement unit 11 or the second measurement unit 21 or both thereof become incapable of measurement, even though the output unit 40 outputs the signal in response to the difference in the components which are respectively measured by the first measurement unit 11 and the second measurement unit 21, it is difficult to indicate an accurate value which shows the magnetic field of the object to be measured 50 on the basis of the signal thereof.

In the magnetic field measurement apparatus 90, even in a case in which the magnetic field noise which exceeds the dynamic range is received, since the magnetic field is generated toward the measurement space A by the coil 31 and the coil 32 so as to reduce the component measured by the second measurement unit 21, the magnetic field noise thereof is attenuated inside the measurement space A and it is possible to suppress the influence from the magnetic field noise with respect to the measurement of the magnetic field of the object to be measured 50.

In addition, the magnetic field which is generated by the coil 31 and coil 32 toward the measurement space A is arranged to reduce the component measured by the second measurement unit 21, however, since the second gas cell 20, which is a measurement target of the second measurement unit 21, is disposed in a different position from the object to be measured 50, there also is a possibility that the influence of the magnetic field noise received by the object to be measured 50 may not be completely cancelled in the measurement space A. However, the first gas cell 10 is disposed near the object to be measured 50 compared to the second gas cell 20 since other gas cells are not disposed between the first gas cell 10 and the object to be measured 50. Meanwhile, since the first gas cell 10 is disposed between the second gas cell 20 and the object to be measured 50, the second gas cell 20 is disposed further out from the object to be measured 50 compared to the first gas cell 10. As a result, since the magnitude of the magnetic field generated by the object to be measured 50 is inversely proportional to the square of the distance from the object to be measured 50, the second gas cell 20 has difficulty in detecting the magnetic field of the object to be measured 50 compared to the first gas cell 10. Since the output unit 40 of the magnetic field measurement apparatus 90 outputs the signal in response to the difference in the measurement results by the second measurement unit 21 of the second gas cell 20 and by the first measurement unit 11 of the first gas cell 10, the influence from the magnetic field noise received by both the first gas cell 10 and the second gas cell 20 is cancelled and the influence from the magnetic field derived from the object to be measured 50 is extracted. Therefore, even regarding this point, the influence from the magnetic field noise with respect to the measurement of the magnetic field of the object to be measured 50 can be suppressed.

In addition, the magnetic field measurement apparatus 90 according to the embodiment described above serves as a so-called first derivative gradiometer in which the output unit 40 outputs the signal in response to the difference in the measurement results of the first gas cell 10 and the second gas cell 20; however, the magnetic field measurement apparatus 90 may be configured by multiple stages in order to serve as a second derivative gradiometer or a derivative gradiometer of higher order.

Moreover, the magnetic field measurement apparatus 90 according to the embodiment described above is arranged to set only the component in one direction, that is, in the positive z direction among the magnetic fields as the measurement target; however, a magnetic field measurement system may be provided which measures a magnetic field of, for example, two dimensional space or three dimensional space by providing a plurality of the magnetic field measurement apparatuses 90 in each independent direction. The magnetic field measurement system is arranged to set the components in a plurality of independent directions as the measurement targets. Therefore, the magnetic field measurement system is an example of a magnetic field measurement system which includes a plurality of the magnetic field measurement apparatuses in each independent direction.

Figure 3:
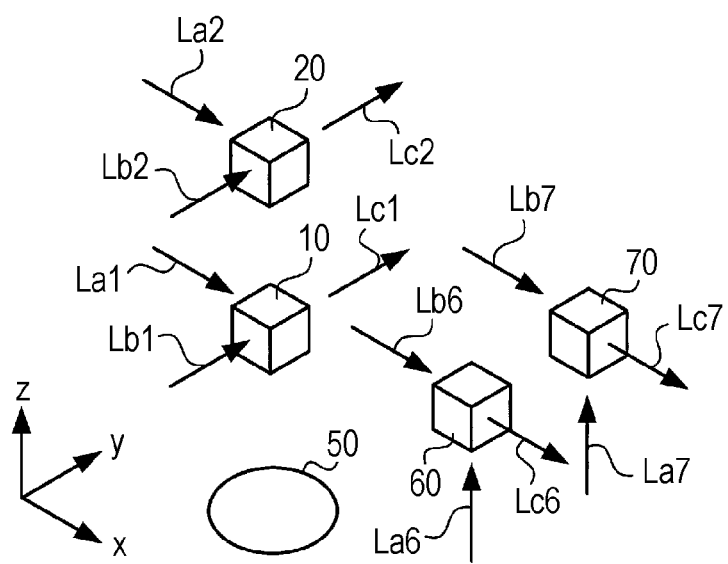
FIG. 3 is a diagram which illustrates disposition of configuration elements of a magnetic field measurement system in which two magnetic field measurement apparatuses are provided.

For example, FIG. 3 is a diagram which illustrates disposition of each gas cell in a magnetic field measurement system provided with the two magnetic field measurement apparatus 90. As shown in FIG. 3, also by providing the configuration of the magnetic field measurement apparatus 90 described above in the positive y direction, the component in the positive y direction may be measured in addition to the component in the positive z direction among the magnetic field of the object to be measured 50.

In this magnetic field measurement system, in addition to the first gas cell 10 and the second gas cell 20 which are disposed in the positive z direction when seen from the object to be measured 50, a third gas cell 60 which is disposed in the positive y direction when seen from the object to be measured 50 and a fourth gas cell 70 which is disposed in the positive y direction when seen from the third gas cell 60 are included.

In the disposition shown in FIG. 3, pump light La6 is irradiated toward the third gas cell 60 from the negative z direction when seen from the third gas cell 60 and pump light La7 is irradiated toward the fourth gas cell 70 form the negative z direction when seen from the fourth gas cell 70. Atoms such as alkali metal which are filled in the third gas cell 60 and the fourth gas cell 70 are excited by these pump light beams.

In addition, probe light Lb6 is irradiated toward the third gas cell 60 from the negative x direction when seen from the third gas cell 60 and probe light Lb7 is irradiated toward the fourth gas cell 70 from the negative x direction when seen from the fourth gas cell 70. Subsequently, probe light Lc6 which passes through the third gas cell 60 and proceeds in the positive x direction when seen from the third gas cell 60 and probe light Lc7 which passes through the fourth gas cell 70 and proceeds in the positive x direction when seen from the fourth gas cell 70 are respectively detected and each of the magnetic fields of the third gas cell 60 and the fourth gas cell 70 are measured by measuring rotational angles of the respective polarization surfaces.

The object to be measured 50, the third gas cell 60 and the fourth gas cell 70 are interposed along the positive y direction by two coils which are not shown. The two coils generate the magnetic field of the inverse phase to a signal in response to the measurement result of the magnetic field in the fourth gas cell 70 toward the measurement space in which the object to be measured 50, the third gas cell 60 and the fourth gas cell 70 are disposed. By receiving the magnetic field of the inverse phase, the magnetic field received by the fourth gas cell 70 from the outside of the magnetic field measurement system is cancelled. Moreover, since the third gas cell 60 receives the magnetic field of the inverse phase, the magnetic field which is received by the third gas cell 60 and is not received by the fourth gas cell 70 remains in the third gas cell 60.

As a result, from the prove light beams which pass through the first gas cell 10 and the second gas cell 20, the component in the positive z direction of the magnetic field in the object to be measured 50 is measured and from the probe light beams which pass through the third gas cell 60 and the fourth gas cell 70, the component in the positive y direction of the magnetic field in the object to be measured 50 is measured. Here, the irradiation directions of the pump light and the probe light are simple example and aspects of the irradiation of these light beams in the magnetic field measurement system is not limited to the example.

What is claimed is:

1. A magnetic field measurement apparatus, comprising:
   a first gas cell;
   a second gas cell;
   the apparatus having a measurement position in which an object to be measured is located,
   the first gas cell and the second gas cell being disposed along a first direction in a given order;
   a first measurement unit which irradiates light to the first gas cell and measures a first direction component of a magnetic field in the first gas cell;
   a second measurement unit which irradiates light to the second gas cell and measures the first direction component of a magnetic field in the second gas cell; and
   a magnetic field generation section which generates a magnetic field toward the second gas cell to reduce the first direction component of magnetic field in the second gas cell.

2. A magnetic field measurement apparatus according to claim 1,
   wherein the magnetic field generation section includes a first coil and a second coil,
   wherein the first coil, the first gas cell, the second gas cell, the second coil are disposed along the first direction in this order.

3. A magnetic field measurement apparatus according to claim 2, wherein the measurement position is between the first coil and the first gas cell.

4. A magnetic field measurement apparatus according to claim 1, further comprising:
   a third gas cell and a fourth gas cell, the third gas cell and the fourth gas cell being disposed along a second direction, the second direction crossing the first direction,
   a third measurement unit which irradiates light to the third gas cell and measures a second direction component of a magnetic field in the third gas cell;
   a fourth measurement unit which irradiates light to the fourth gas cell and measures the second direction component of a magnetic field in the fourth gas cell; and
   a second magnetic field generation section which generates a magnetic field toward the fourth gas cell to reduce the second direction component of the magnetic field in the fourth gas cell.

5. A magnetic field measurement apparatus according to claim 4,
   wherein the second magnetic field generation section includes a third coil and a fourth coil;
   wherein the third coil, the third gas cell, the fourth gas cell, the fourth coil are disposed along the second direction in this order.

* * * * *